(12) United States Patent
Lin et al.

(10) Patent No.: US 12,046,688 B2
(45) Date of Patent: Jul. 23, 2024

(54) LIGHT SENSING UNIT OF LIGHT SENSING DEVICE

(71) Applicant: HannsTouch Solution Incorporated, Tainan (TW)

(72) Inventors: Sheng-Chia Lin, Tainan (TW); Ching-Feng Tsai, Tainan (TW)

(73) Assignee: HannsTouch Holdings Company, Tainan (TW)

( * ) Notice: Subject to any disclaimer, the term of this patent is extended or adjusted under 35 U.S.C. 154(b) by 276 days.

(21) Appl. No.: 17/385,927

(22) Filed: Jul. 27, 2021

(65) Prior Publication Data
US 2023/0034080 A1    Feb. 2, 2023

(51) Int. Cl.
*H01L 31/0352* (2006.01)
*H01L 31/02* (2006.01)
*H01L 31/0224* (2006.01)

(52) U.S. Cl.
CPC .... *H01L 31/0352* (2013.01); *H01L 31/02016* (2013.01); *H01L 31/022475* (2013.01); *H01L 31/022483* (2013.01)

(58) Field of Classification Search
CPC ........... H01L 31/0352; H01L 31/02016; H01L 31/022475; H01L 31/022483; H01L 27/14678; H01L 31/1136; G06V 40/1318
See application file for complete search history.

(56) References Cited

U.S. PATENT DOCUMENTS

| | | | | |
|---|---|---|---|---|
| 2003/0183019 A1* | 10/2003 | Chae | .................. | G06V 40/1318 257/E27.111 |
| 2005/0275038 A1* | 12/2005 | Shih | .................. | H01L 29/78648 257/382 |
| 2012/0154704 A1* | 6/2012 | Nakazawa | ............ | H01L 31/101 257/53 |
| 2013/0207102 A1* | 8/2013 | Miyake | ............. | H01L 29/42384 257/43 |
| 2014/0306218 A1* | 10/2014 | Koezuka | ............. | H01L 27/1248 257/43 |
| 2014/0331875 A1* | 11/2014 | Frye | ........................ | G01B 9/02 101/170 |
| 2015/0145840 A1* | 5/2015 | Lim | .................... | H01L 29/7869 345/207 |
| 2015/0268498 A1* | 9/2015 | Hara | ....................... | H01L 29/24 257/43 |
| 2015/0294099 A1* | 10/2015 | Frye | .................... | G06V 40/1318 340/5.83 |

(Continued)

*Primary Examiner* — Bitew A Dinke
(74) *Attorney, Agent, or Firm* — Winston Hsu

(57) ABSTRACT

The present invention discloses a light sensing unit of a light sensing device including a light sensing element and a switching element. The light sensing element includes a gate, a semiconductor layer, a gate insulating layer, a source, and a drain. The gate and the semiconductor layer are disposed on a substrate, the gate insulating layer separates the gate from the semiconductor layer, and the source and the drain are connected to the semiconductor layer respectively. At least one of the source and the drain are formed of a light-transmissive conductive layer. The semiconductor layer is disposed between one of the source and the drain and the gate, and when viewed along a normal direction of the substrate, the gate overlaps the one of the source and the drain, and the gate does not overlap another one of the source and the drain.

13 Claims, 10 Drawing Sheets

(56) References Cited

U.S. PATENT DOCUMENTS

| | | | |
|---|---|---|---|
| 2016/0209719 A1* | 7/2016 | Yamaguchi | G02F 1/134309 |
| 2018/0006056 A1* | 1/2018 | Bae | H01L 29/66969 |
| 2018/0025200 A1* | 1/2018 | Frye | G06F 21/32 |
| | | | 257/9 |
| 2019/0393286 A1* | 12/2019 | Ding | H10K 59/60 |
| 2020/0152802 A1* | 5/2020 | Takeda | H01L 29/66969 |
| 2022/0013569 A1* | 1/2022 | Lin | H01L 27/14643 |
| 2022/0157268 A1* | 5/2022 | Ishii | H01L 27/1214 |
| 2022/0165806 A1* | 5/2022 | Yun | H10K 59/1216 |
| 2022/0308379 A1* | 9/2022 | Ozeki | H01L 27/124 |
| 2022/0365397 A1* | 11/2022 | Douyou | G02F 1/13685 |

* cited by examiner

LIGHT SENSING UNIT OF LIGHT SENSING DEVICE

BACKGROUND OF THE INVENTION

1. Field of the Invention

The present invention relates to a light sensing unit of a light sensing device.

2. Description of the Prior Art

Since the light sensing device has a plurality of light sensing elements arranged in an array, it can be applied in the fields of image detection, optical touch sensing, X-ray detection, and the like. As higher resolution of detected image is required, even for the purpose of detecting fingerprint image, sizes of the light sensing elements need to be reduced to increase density of the light sensing elements. However, shrinkage of the light sensing element affects light-receiving area of the light sensing element, thereby reducing the signal-to-noise ratio (SNR) and reducing definition of the detected image.

SUMMARY OF THE INVENTION

An embodiment of the present invention provides a light sensing unit of a light sensing device including a light sensing element and a switching element. The light sensing element includes a first gate, a first semiconductor layer, a gate insulating layer, a first source, and a first drain. The first gate is disposed on a substrate, the first semiconductor layer is disposed on the substrate, the gate insulating layer separates the first gate from the first semiconductor layer, and the first source and the first drain are connected to the first semiconductor layer respectively. At least one of the first source and the first drain is formed of a light-transmissive conductive layer. The first semiconductor layer is disposed between one of the first source and the first drain and the first gate. When viewed along a normal direction of the substrate, the first gate overlaps the one of the first source and the first drain, and the first gate does not overlap another one of the first source and the first drain. The switching element is electrically connected to the light sensing element, and the switching element includes a second source and a second drain.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
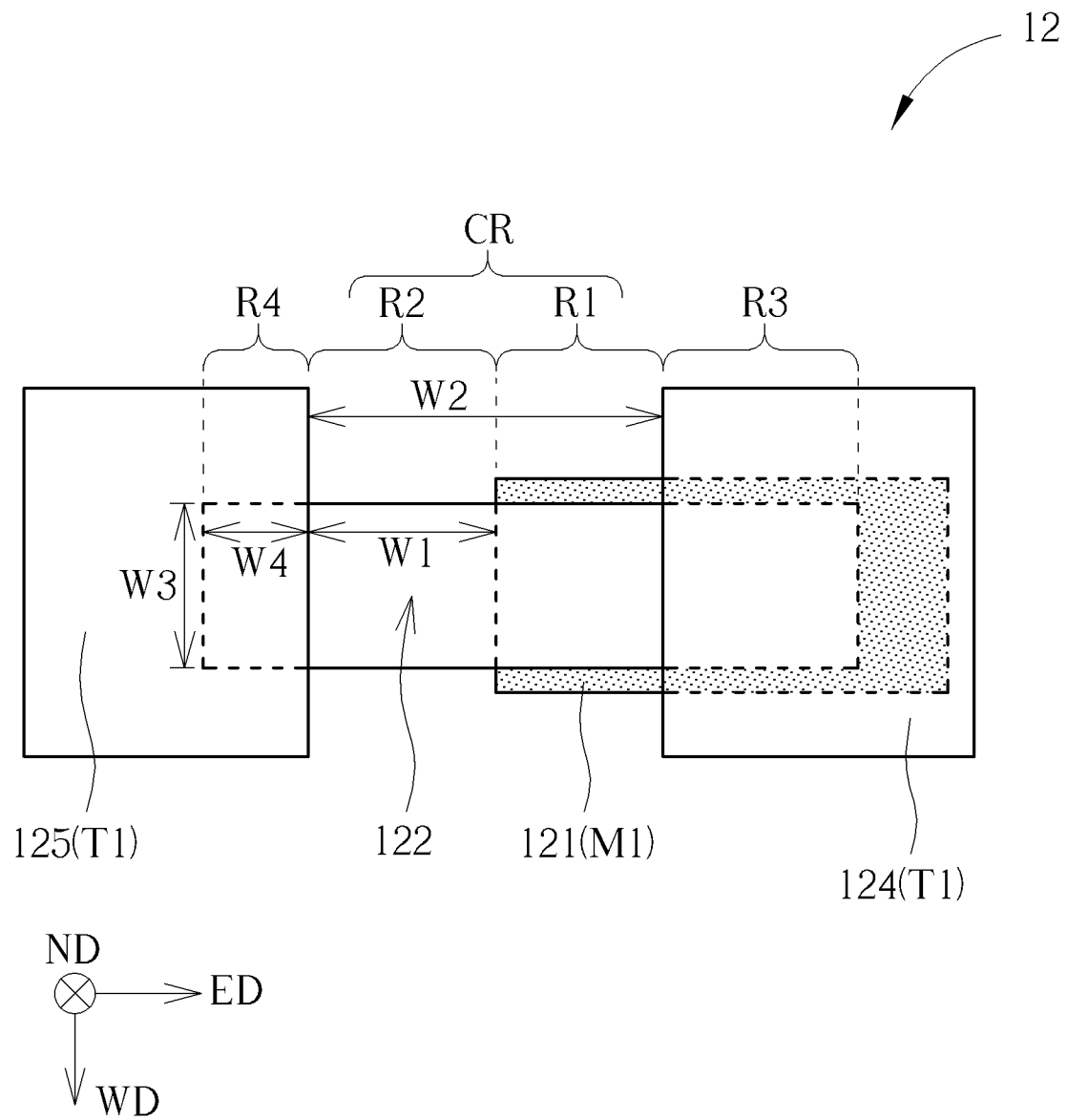
FIG. 1 schematically illustrates a top view of a light sensing element according to an embodiment of the present invention.

The contents of the present invention will be described in detail with reference to specific embodiments and drawings. It is noted that, for purposes of illustrative clarity and being easily understood by the readers, the following drawings may be simplified schematic diagrams, and elements therein may not be drawn to scale. The numbers and dimensions of the elements in the drawings are just illustrative and are not intended to limit the scope of the present invention.

When ordinal numbers, such as "first" and "second", used in the specification and claims are used to modify elements in the claims, they do not mean and represent that the claimed elements have any previous ordinal numbers, nor do they represent the order of a claimed element and another claimed element, or the order of manufacturing methods. These ordinal numbers are just used to distinguish a claimed element with a certain name from another claimed element with the same name.

Figure 2:
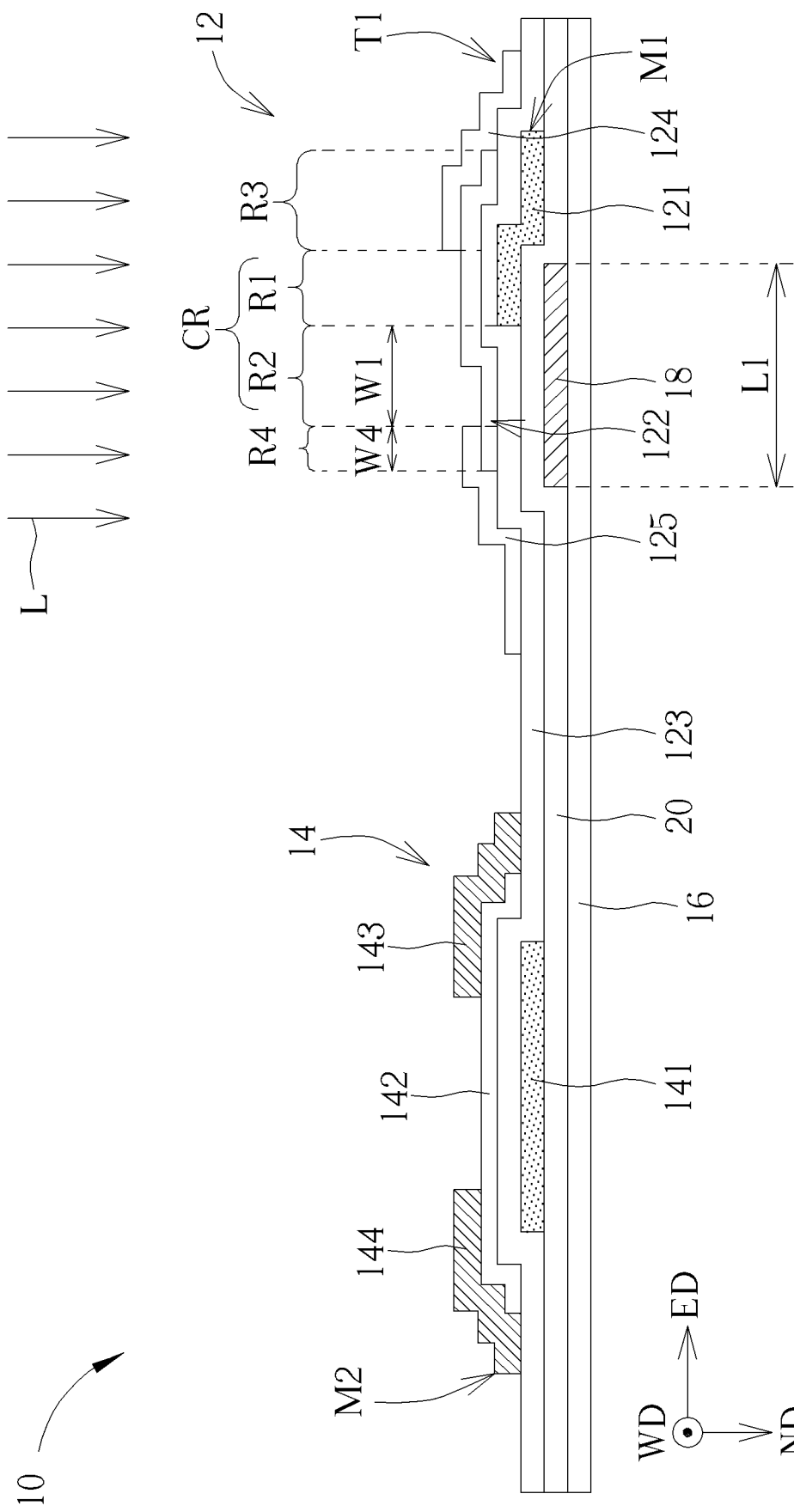
FIG. 2 schematically illustrates a cross-sectional view of a light sensing unit according to an embodiment of the present invention.

FIG. 1 schematically illustrates atop view of a light sensing element according to an embodiment of the present invention, and FIG. 2 schematically illustrates a cross-sectional view of a light sensing unit according to an embodiment of the present invention. As shown in FIG. 1 and FIG. 2, the light sensing unit 10 may include a light sensing element 12 and a switching element 14. The switching element 14 is electrically connected to the light sensing element 12 to control whether to read light sensing signal detected from the light sensing element 12. Specifically, the light sensing element 12 may include a gate 121, a semiconductor layer 122, a gate insulating layer 123, a source 124, and a drain 125. The gate 121 may be disposed on the substrate 16, and the semiconductor layer 122 may be disposed on the gate insulating layer 123, the gate insulating layer 123 may be disposed between the gate 121 and the semiconductor layer 122 and separate the gate 121 and the semiconductor layer 122. The source 124 and the drain 125 are respectively connected to the semiconductor layer 122, for example, may be respectively disposed on both sides of the semiconductor layer 122, and a part of the semiconductor layer 122 may be disposed between one of the source 124 and the drain 125 and the gate 121. In order to clearly show the structure of the light sensing element 12 and the switching element 14, FIG. 1 omits the gate insulating layer 123 of the light sensing element 12, and FIG. 2 omits the manner that the light sensing element 12 is electrically connected to the switching element 14, but not limited thereto. In the embodiment of FIG. 2, the gate 121 may be disposed between the semiconductor layer 122 and the substrate 16; that is, the light sensing element 12 may be, for example, a bottom-gate type thin film transistor, but not limited thereto. In some embodiments, the light sensing element 12 may be a thin film transistor of another type.

In an embodiment, the semiconductor layer 122 may include a material that is capable of absorbing light and converting the light into electric charges, and the material is for example amorphous silicon, polysilicon, oxide semiconductor, or other suitable semiconductor materials, so that the light sensing element 12 may be used for detecting intensity of light. In some embodiments, the semiconductor layer 122 may include two layers, one of which includes amorphous silicon, and the other includes amorphous silicon doped with n-type dopants, but not limited thereto. The gate 121 may be formed of a non-transparent conductive layer M1. The non-transparent conductive layer M1 may include, for example, a metal material, and the metal material may include, for example, molybdenum, titanium, chromium, tantalum, tungsten, aluminum, copper, alloys thereof, combinations thereof, or other suitable materials. The gate insulating layer 123 may include an insulating material and is used for electrically insulating the gate 121 from the semiconductor layer 122, the source 124, and the drain 125. The insulating material may, for example, include silicon oxide, silicon nitride, silicon oxynitride, or other suitable materials. The substrate 16 may, for example, include a soft (flexible) or rigid transparent substrate, such as glass, quartz, sapphire, plastic, or other suitable substrates.

At least one of the source 124 and the drain 125 of the light sensing element 12 may be formed of a light-transmissive conductive layer T1. It should be noted that the light-transmissive conductive layer T1 refers to a layer that allows light to pass through. For example, the light-transmissive conductive layer T1 may, for example, include a transparent conductive material that allows light to pass through or a layer that structurally allows light to pass through but is not easily recognized by human eyes. In the embodiment of FIG. 1 and FIG. 2, the source 124 and the drain 125 may both be formed of the light-transmissive conductive layer T1. The light-transmissive conductive layer T1 may include a transparent conductive material, and the source 124 and the drain 125 may not have a through opening penetrating through the light-transmissive conductive layer T1. In other words, the light-transmissive conductive layer T1 may be, for example, a transparent conductive layer. The transparent conductive material may, for example, include indium tin oxide (ITO), indium zinc oxide (IZO) or other suitable materials. The layer mentioned above that allows light to pass through but is not easily recognized by human eyes may also include non-transparent conductive materials, such as silver nanowires, metal mesh, thin metal, or other suitable layers. For example, the transmittance of the light-transmissive conductive layer T1 may be greater than 75%.

As shown in FIG. 1 and FIG. 2, when viewed along a normal direction ND of the substrate 16, the gate 121 may overlap one of the source 124 and the drain 125, and the gate 121 does not overlap another one of the source 124 and the drain 125. In the embodiment of FIG. 1 and FIG. 2, the gate 121 may overlap the source 124 and not overlap the drain 125. In other words, the light sensing element 12 may be, for example, a deviated-gate type thin film transistor. Specifically, when viewed along the normal direction ND of the substrate 16, the gate 121 is not disposed in the middle between the source 124 and the drain 125 and is offset to one of the source 124 and the drain 125. When viewed along the normal direction ND of the substrate 16, the semiconductor layer 122 may have a channel region CR located between the source 124 and the drain 125, and the channel region CR may have a first region R1 overlapping the gate 121 and a second region R2 without overlapping the gate 121. When viewed along the normal direction ND, a gap corresponding to the second region R2 exists between the gate 121 and the drain 125, so that a resistance of the channel region CR is mainly composed of a resistance of the second region R2. Accordingly, a drain current of the light sensing element 12 does not change significantly due to the change of the gate voltage but is significantly altered with the intensity of light received by the light sensing element 12. Therefore, through the design of the second region R2 that does not overlap the gate 121, the drain current of the light sensing element 12 as the light sensing element 12 is not irradiated by light L and the drain current of the light sensing element 12 when the light sensing element 12 is irradiated by the light L may be significantly different, so that the light sensing signal may be obtained by measuring the difference between the drain currents. In some embodiments, a width W1 of the second region R2 in the extending direction ED of the semiconductor layer 122 (that is, a length direction of the channel region CR) may be adjusted to change variation of the drain current of the light sensing element 12 that is irradiated by the light L. In some embodiments, a width W1 of the second region R2 in the extending direction ED may be greater than or equal to 0.1 times the width W2 of the channel region CR in the extending direction ED and less than or equal to 0.9 times the width W2 (i.e., $0.1 \times W2 \le W1 \le 0.9 \times W2$), preferably $0.2 \times W2 \le W1 \le 0.8 \times W2$. For example, the width W1 of the second region R2 may be 0 micron(μm) to 10 μm. In other embodiments, the gate 121 may overlap the drain 125 and may not overlap the source 124.

In the embodiment of FIG. 1 and FIG. 2, since the source 124 and the drain 125 may be formed of the light-transmissive conductive layer T1, the light L may penetrate through the source 124 and the drain 125, and therefore, the light L enters the semiconductor layer 122 from a side of the semiconductor layer 122 opposite to the substrate 16 not only may be absorbed by the first region R1 and the second region R2, but also may pass through the source 124 and the drain 125 and be irradiated to a third region R3 of the semiconductor layer 122 overlapping the source 124 and a fourth region R4 of the semiconductor layer 122 overlapping the drain 125. Accordingly, as compared with a case that the source 124 and the drain 125 are formed of a non-transparent conductive layer, a light-receiving area of the semiconductor layer 122 of this embodiment may be increased to raise the electric charges generated by irradiating the semiconductor layer 122 with light and the drain current when the semiconductor layer 122 is irradiated by the light, thereby improving the signal-to-noise ratio of the light sensing element 12. The light sensing element 12 may, for example, be applied to optical touch sensing or optical fingerprint recognition. It is noted that, since the drain currents of the light sensing element 12 of this embodiment when the light sensing element 12 receives different intensities of light have a significant difference, when the light sensing element 12 is applied to the fingerprint recognition, the light sensing element 12 may still be able to significantly detect intensity degrees of the light. Accordingly, the light sensing element 12 may be used for detecting greyscale values of fingerprint images.

As shown in FIG. 2, the switching element 14 may include a gate 141, a semiconductor layer 142, a gate insulating layer 123, a source 143, and a drain 144. The gate 141 may be disposed on the substrate 16, the semiconductor layer 142 may be disposed on the substrate 16 and the gate 141, and the gate insulating layer 123 may be disposed between the gate 141 and the semiconductor layer 142 and separate the gate 141 and the semiconductor layer 142. The source 143 and the drain 144 are respectively connected to the semiconductor layer 142, and a part of the semiconductor layer 142 may be disposed between the source 143 and the gate 141 and between the drain 144 and the gate 141. When viewed along the normal direction ND of the substrate 16, the gate 141 may overlap the source 143 and the drain 144. In the embodiment of FIG. 2, the gate 141 and the gate 121 may be formed of the same non-transparent conductive layer M1, for example. The source 143 and the drain 144 may include a non-transparent conductive material, for example, may be formed of a non-transparent conductive layer M2, and the non-transparent conductive layer M2 may include a metal material, for example. Also, the semiconductor layer 142 may include the same semiconductor material as the semiconductor layer 122, for example. It is noted that, since a manufacturing process of the light sensing element 12 of this embodiment may be easily integrated into the manufacturing process of the switching element 14; that is, only an additional mask is needed, so the light sensing unit 10 of this embodiment may have a lower manufacturing cost as compared with the light sensing unit of traditional PIN type photodiode that requires multiple photomasks, but the present invention is not limited to this. In some embodiments, the semiconductor layer 142 may include a semiconductor material different from the semiconductor layer 122 according to the difference in functional characteristics. It is noted that both or one of the source 143 and the drain 144 may be formed of the light-transmissive conductive layer, in which the light-transmissive conductive layer of the source 143 and/or the drain 144 and the light-transmissive conductive layer of the sensing element 12 may be formed together; that is, formed by the same process.

As shown in FIG. 2, in some embodiments, the light sensing unit 10 may further include a light blocking layer 18 disposed under the semiconductor layer 122, so as to shield light propagating toward the semiconductor layer 122 from below, thereby reducing the drain current of the light sensing element 12 when the light sensing element 12 is not irradiated with light and improving the signal-to-noise ratio of the light sensing element 12. In the embodiment of FIG. 2, when viewed along the normal direction ND of the substrate 16, a total projection area of both the light blocking layer 18 and the gate 121 projected onto the substrate 16 may be greater than or equal to a projection area of the semiconductor layer 122 projected onto the substrate 16, but not limited thereto. In some embodiments, a width of the light blocking layer 18 in one direction (e.g., a direction WD perpendicular to the extending direction ED of the semiconductor layer 122 shown in FIG. 1) may be greater than or equal to a width W3 of the semiconductor layer 122 in the same direction, and a length L1 of the light blocking layer 18 in the extending direction ED of the semiconductor layer 122 may be greater than or equal to a sum of the width W1 of the second region R2 in the extending direction ED and a width W4 of the fourth region R4 in the extending direction ED of the semiconductor layer 122. In some embodiments, an area of the light blocking layer 18 may be greater than or equal to an area of the semiconductor layer 122. In the embodiment of FIG. 2, the light blocking layer 18 may include a non-transparent conductive layer, and the light sensing unit 10 may further include an insulating layer 20 disposed between the light blocking layer 18 and the gate 121 and between the light blocking layer 18 and the gate insulating layer 123, but not limited thereto. In some embodiments, the light blocking layer 18 may include, for example, a non-transparent insulating material. In this case, the light sensing unit 10 may not include the insulating layer 20. The light blocking layer 18 of the present invention is not limited to that shown in FIG. 2 and may be disposed at any position under the semiconductor layer 122 according to requirements. In some embodiments, another light blocking layer may be provided above the switching element 14 to shield the light L from irradiating the semiconductor layer 142, thereby preventing the switching element 14 from being turned on abnormally. For example, when the display device is disposed on the light sensing unit 10, the light blocking layer on the switching element 14 may be a black matrix layer of the display device, but not limited thereto. In another embodiment, it is noted that the light blocking layer 18 and the insulating layer 20 are optional, and the light sensing unit 10 may not require the light blocking layer 18 and the insulating layer 20. Whether the light blocking layer 18 and the insulating layer 20 are installed depends on the type of the display device combined with the light sensing unit 10 and relative positions of the light sensing unit 10 and the combined display device.

Figure 3:
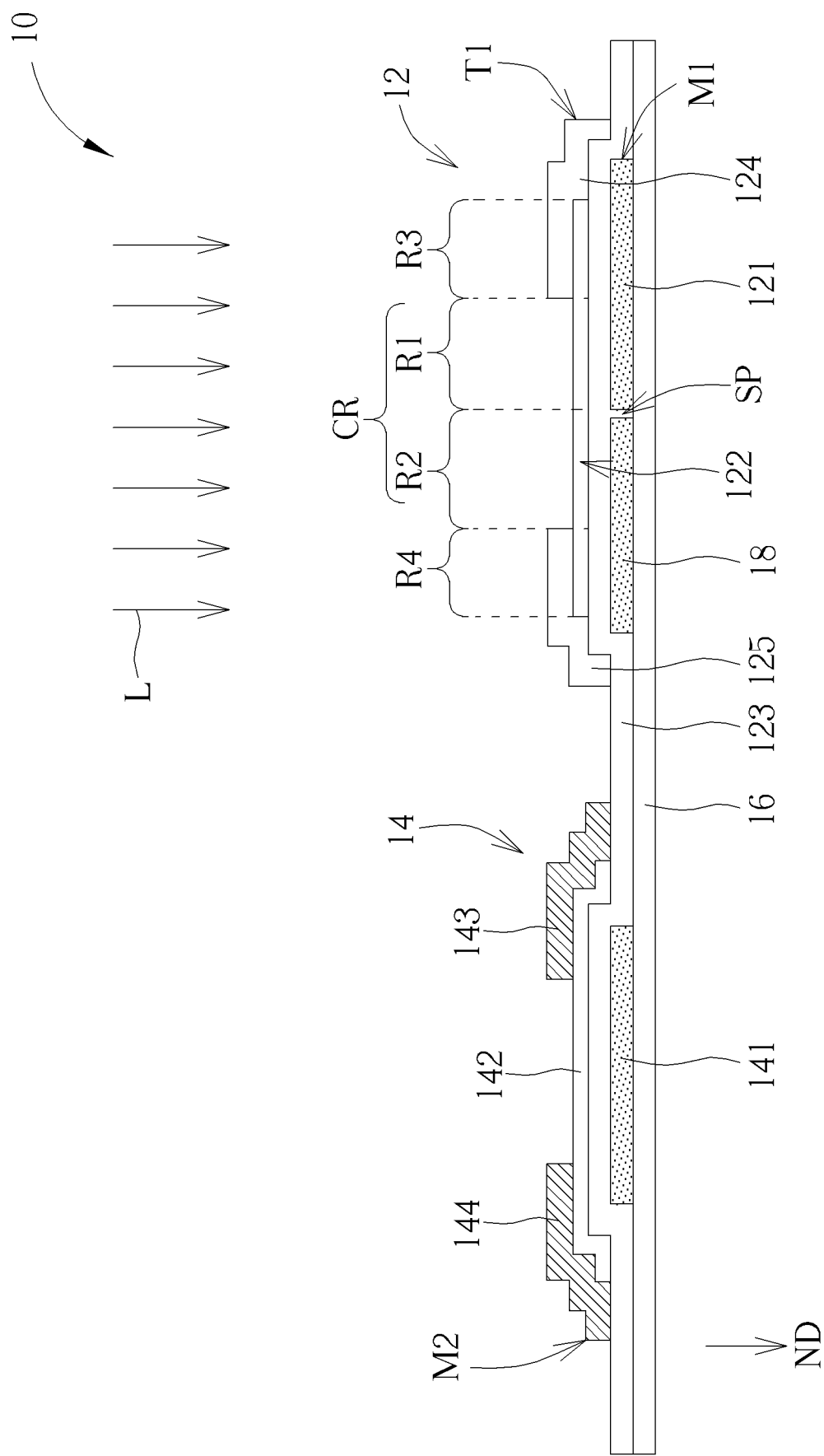
FIG. 3 schematically illustrates a cross-sectional view of a light sensing unit according to another embodiment of the present invention.

In another embodiment, the light blocking layer 18 and the gate 121 may be formed on the same horizontal level, for example, may be formed of the same material or different materials. As shown in FIG. 3, when the light blocking layer 18 and the gate 121 are formed of the same conductive material, for example, formed of the same non-transparent conductive layer M1, a gap SP is required to be between the light blocking layer 18 and the gate 121 to prevent electrical connection between them. Alternatively, when the light blocking layer 18 is formed of a non-transparent insulating material, the light blocking layer 18 may be connected to the gate 121, and no gap SP may be between them. It should be noted that the light blocking layer 18 is optional 18 and may not exist in the light sensing unit 10 as shown in FIG. 3.

Figure 9:
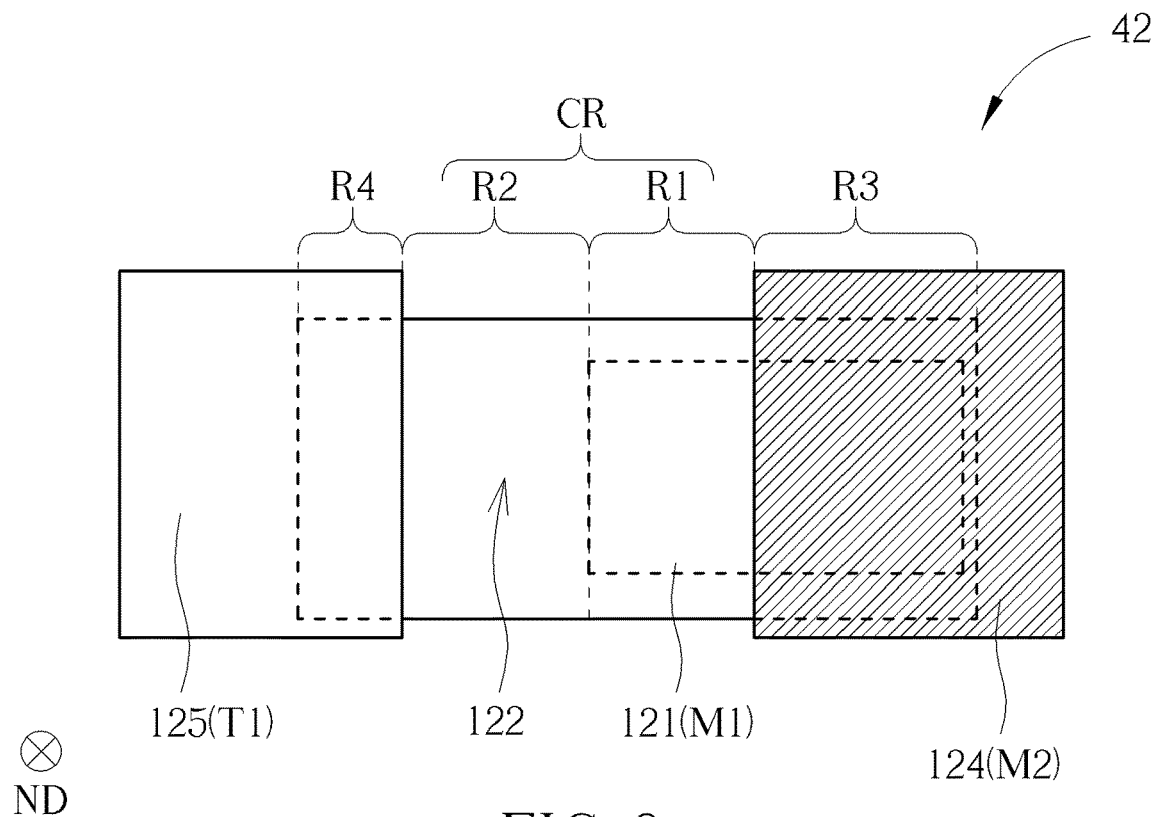
FIG. 9 schematically illustrates a top view of a light sensing element according to another embodiment of the present invention.

In some embodiments, when viewed along the normal direction ND of the substrate 16, a side of the third region R3 of the semiconductor layer 122 may extend beyond a side of the gate 121. For example, as shown in FIG. 9, four sides of the semiconductor layer 122 may surround the gate 121; that is, an overall area of the semiconductor layer 122 may be greater than an overall area of the gate 121, and in the normal direction ND, an area projection of the gate 121 may be within the area of the semiconductor layer 122, but not limited to this.

Figure 4:
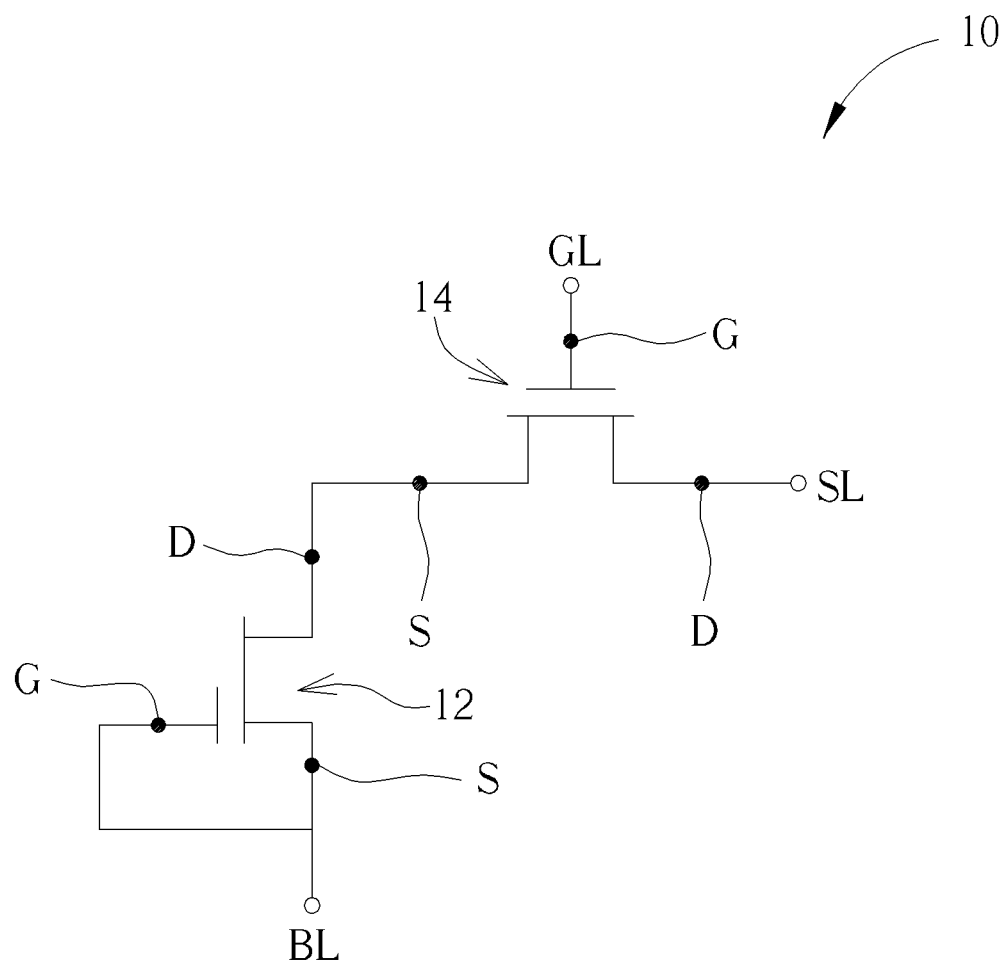
FIG. 4 schematically illustrates a circuit diagram of a light sensing unit according to an embodiment of the present invention.

FIG. 4 schematically illustrates a circuit diagram of a light sensing unit according to an embodiment of the present invention. As shown in FIG. 4, the light sensing element 12 and the switching element 14 may include a control terminal G, a first terminal S, and a second terminal D, respectively. In the embodiment of FIG. 4, the first terminal S and the second terminal D of the switching element 14 may be electrically connected to the second terminal D of the light sensing element 12 and a sensing line SL, respectively, the control terminal G of the switching element 14 may be electrically connected to the scan line GL, and the first terminal S and the control terminal G of the light sensing element 12 may be electrically connected to each other and electrically connected to a bias line BL. In addition, the control terminal G, the first terminal S, and the second terminal D of the light sensing element 12 may be the gate 121, the source 124, and the drain 125 shown in FIG. 2 respectively, and the control terminal G, the first terminal S and the second terminal D of the switching element 14 may be the gate 141, the source 143, and the drain 144 shown in FIG. 2, but are not limited thereto. In some embodiments, when the gate 121 overlaps the drain 125 but not the source 124, the first terminal S and the second terminal D of the light sensing element 12 may be the drain 125 and the source 124, respectively. The light sensing unit 10 and the electrical connection between the light sensing element 12 and the switching element 14 of the present invention may not be limited to that shown in FIG. 4, and a circuit in the light sensing unit 10 may be adjusted according to the requirements.

Figure 5:
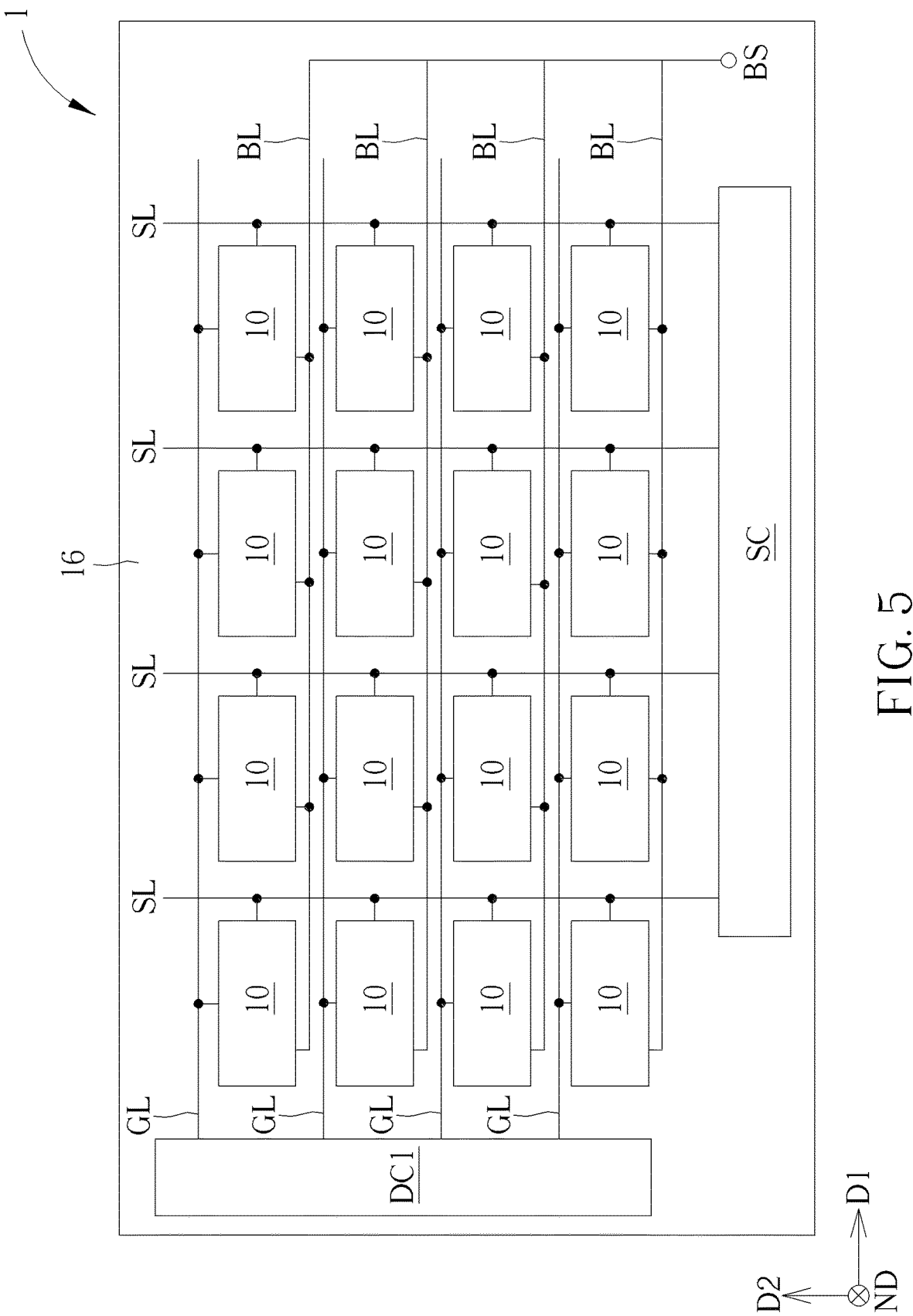
FIG. 5 schematically illustrates a circuit diagram of a light sensing device according to an embodiment of the present invention FIG. 6 schematically illustrates a cross-sectional view of a light sensing device according to an embodiment of the present invention.
Figure 6:
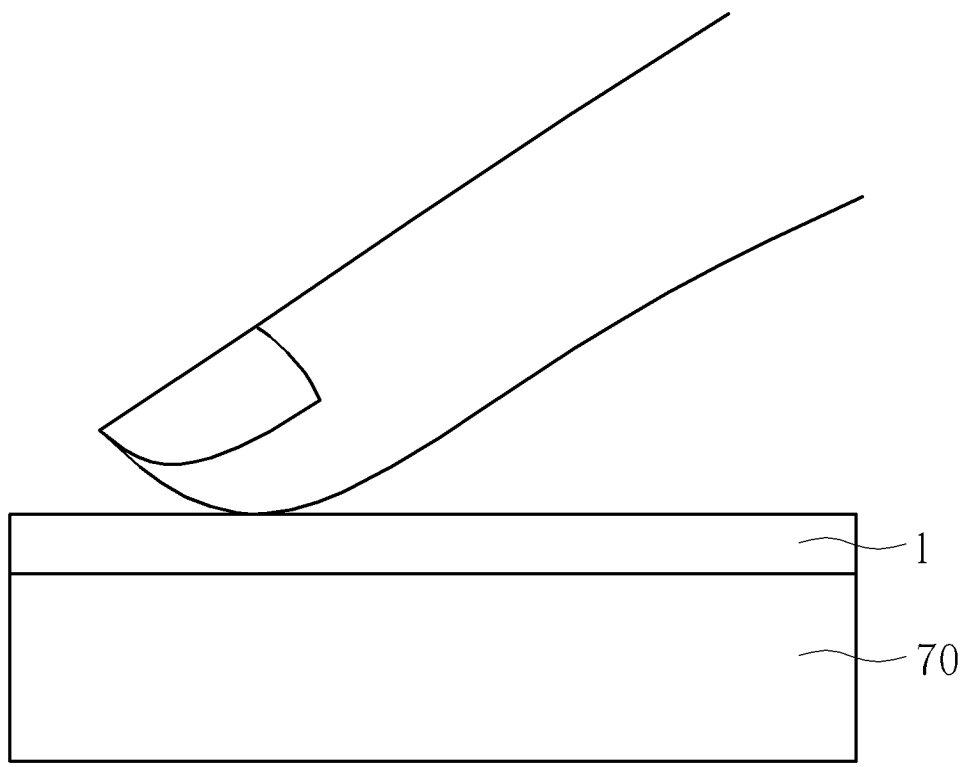

FIG. 5 schematically illustrates a circuit diagram of a light sensing device according to an embodiment of the present invention, and FIG. 6 schematically illustrates a cross-sectional view of a light sensing device according to an embodiment of the present invention. As shown in FIG. 5, the light sensing device 1 may include a plurality of scan lines GL, a plurality of sensing lines SL, a plurality of bias lines BL, and a plurality of light sensing units 10. The light sensing unit 10 of this embodiment takes the light sensing unit 10 shown in FIG. 2 and FIG. 4 as an example, but it is not limited thereto. In some embodiments, the light sensing unit 10 shown in FIG. 5 may be replaced with the light sensing unit of any one of following embodiments or may adopt the light sensing element of any one of following embodiments. Each light sensing unit 10 may be electrically connected to the corresponding scan line GL, the corresponding sensing line SL, and the corresponding bias line BL and used to detect intensity of light. For example, the light sensing units 10 may be arranged in an array or other suitable arrangement, so that the light sensing device 1 may be used for detecting images, such as fingerprint images or other suitable images, or detecting a position where a finger touches. In some embodiments, the scan lines GL, the sensing lines SL, the bias lines BL, and the light sensing units 10 may be disposed and formed on the same substrate 16, but are not limited thereto.

For example, as shown in FIG. 6, the light sensing device 1 may be disposed above the display device 70 to achieve the effect of fingerprint recognition or touch sensing. In some embodiments, the light sensing device 1 may be disposed under the display device 70, but not limited thereto. In such case, the light blocking layer 18 and the insulating layer 20 may not be provided under the light sensing element 12. The display device 70 may, for example, include an organic light-emitting diode (organic light-emitting diode) display device, a micro light-emitting diode display device, a liquid crystal display device, or other suitable display devices. In one embodiment, the light sensor device 1 and the display device 70 may be bonded to each other by an optical clear adhesive.

In the embodiment of FIG. 5, the scan lines GL and the bias lines BL may respectively extend along a row direction (e.g., a direction D1) of the array, and the sensing lines SL may respectively extend along a column direction (e.g., a direction D2) of the array and cross the scan lines GL and the bias lines BL. The light sensing units 10 in the same row may be disposed between one corresponding scan line GL and one corresponding bias line BL, but not limited thereto. In some embodiments, the bias lines BL may extend along the column direction (e.g., direction D2) of the array and be parallel to the sensing lines SL.

In some embodiments, as shown in FIG. 5, the light sensing device 1 may further include a bias voltage source BS, a driving circuit DC1, and a sensing circuit SC. The bias voltage line BL may be electrically connected to the same bias voltage source BS, and the bias voltage provided by the bias voltage source BS is transmitted to the light sensing unit 10. The driving circuit DC1 may be electrically connected to the scan lines GL, and scan signals may be provided to the scan lines GL according to a time sequence, and the sensing circuit SC may be electrically connected to the sensing lines SL to receive the light sensing signals detected by the light sensing units 10 through the sensing lines SL.

As shown in FIG. 4 and FIG. 5, it is noted that as the semiconductor layer (e.g., the semiconductor layer 122 of FIG. 2) of the light sensing element 12 is irradiated with light to generate electric charges, current at the second terminal D of the light sensing element 12 may change. Accordingly, the switching element 14 is turned on by the scan signal in the scan line GL, and the detected current change (i.e., light sensing signal) may be read from the sensing line SL. In this way, fingerprint recognition or other suitable functions may be performed by reading the light sensing signals. Since the source 124 and the drain 125 may be formed of the light-transmissive conductive layer T1 and allowing light to pass through, when the light sensing element 12 is used for detecting fingerprint images, the light-receiving area of the semiconductor layer 122 may be increased. In the case of increasing image resolution, the signal-to-noise ratio may still be maintained or improved, thereby improving the definition of the fingerprint image.

In some embodiments, although not shown in the figures, the light sensing device 1 may optionally further include a reset switching element and a reset line, in which the light sensing element 12 may be electrically connected to a voltage terminal or ground terminal with relative low voltage through the reset line and the reset switching element. When the reset switching element is turned on, a part of or all of remaining electric charges in the light sensing element may be eliminated.

Figure 7:
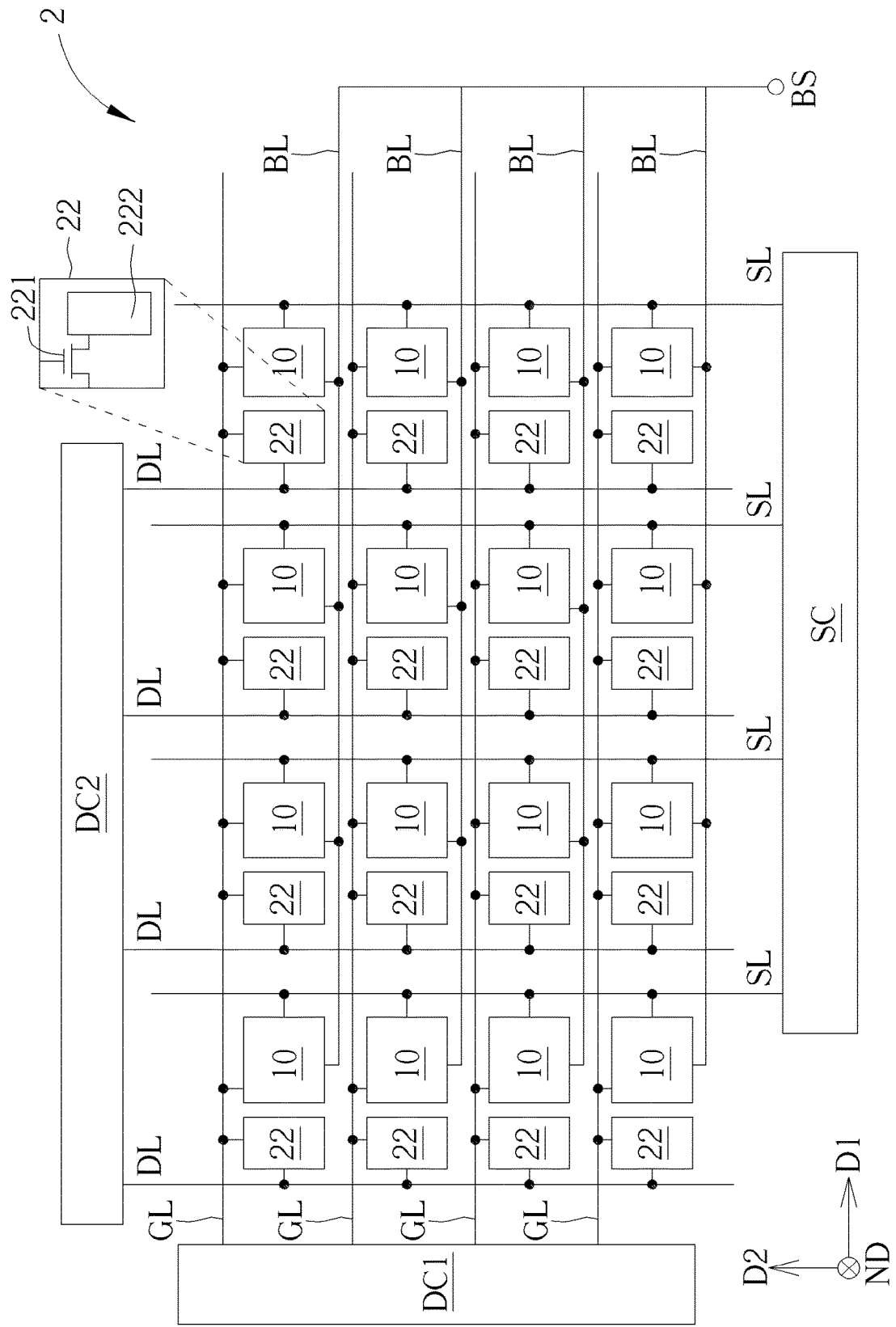
FIG. 7 schematically illustrates a circuit diagram of a light sensing device according to another embodiment of the present invention.

FIG. 7 schematically illustrates a circuit diagram of a light sensing device according to another embodiment of the present invention. As shown in FIG. 7, the light sensing device 2 of this embodiment differs from the light sensing device 1 shown in FIG. 5 in that the light sensing device 2 may further include a plurality of display pixel units 22, so that the light sensing device 2 may further have a display function. In other words, the light sensing units 10 may be embedded in a display device. In the embodiment of FIG. 7, each display pixel unit 22 may correspond to one light sensing unit 10, but not limited to this. In some embodiments, plural display pixel units 22 may correspond to one light sensing unit 10, or one display pixel unit 22 may correspond to plural light sensing units 10. Specifically, the light sensing device 2 may further include data lines DL and a data driving circuit DC2. In addition, each display pixel unit 22 may include a switching transistor 221 and a pixel electrode 222, and a gate, a source, and a drain of the switching transistor 221 may be electrically connected to the corresponding scan line GL, data line DL, and pixel electrode 222, respectively. Through data signals of the data driving circuit DC2 and the scan signals of the driving circuit DC1, the intensities of light from the display pixel units 22 may be controlled to display images. For example, the light sensing device 2 may be applied to a display array substrate of a non-self-luminous display device (such as a liquid crystal display device) or a self-luminous display device (such as a light-emitting diode display device), but not limited thereto. When the light sensing device 2 may be applied to the non-self-luminous display device, the light sensing unit 10 may further include a light blocking layer (e.g., the light blocking layer 18 shown in FIG. 2) disposed under the semiconductor layer to shield light propagating toward the semiconductor layer from below. In some embodiments, the structure of the switching transistor 221 may be the same as that of the switching element 14 shown in FIG. 2, but not limited thereto. In some embodiments, the display pixel unit 22 may include different elements according to different types of display devices, for example, may include light emitting diodes, but not limited thereto. In some embodiments, light generated from the display pixel unit 22 may be used as a light source for detecting fingerprints, but not limited to this.

Figure 8:
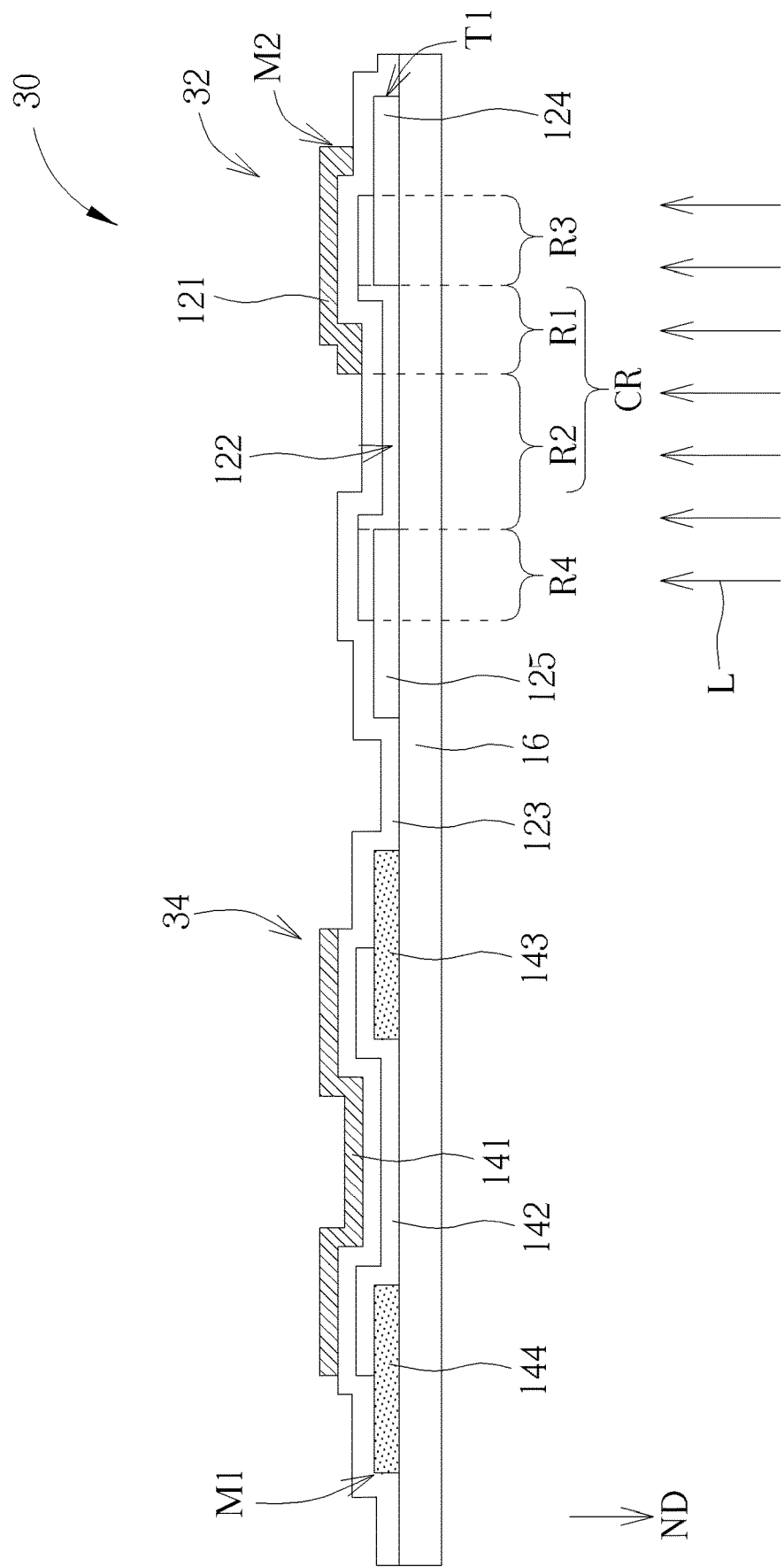
FIG. 8 schematically illustrates a cross-sectional view of a light sensing unit according to another embodiment of the present invention.

FIG. 8 schematically illustrates a cross-sectional view of a light sensing unit according to another embodiment of the present invention. As shown in FIG. 8, the light sensing unit 30 of this embodiment differs from the light sensing unit 10 shown in FIG. 2 in that the light sensing element 32 and the switching element 34 may be top-gate type thin film transistors. Specifically, in the light sensing element 32, the source 124 and the drain 125 may be disposed on the substrate 16, and at least one of them may be formed of the light-transmissive conductive layer. The semiconductor layer 122 may be disposed on the source 124, the drain 125 and the substrate 16, and the semiconductor layer 122 may be connected between the source 124 and the drain 125. The gate 121 may be disposed on one of the source 124 and the drain 125, and the gate insulating layer 123 may be disposed between the gate 121 and the semiconductor layer 122 and separate the gate 121 from the semiconductor layer 122. In this embodiment, the semiconductor layer 122 of the light sensing element 32 may be disposed between the substrate 16 and the gate 121. It is noted that the light L detected by the light sensing element 32 shown in FIG. 8 may enter the substrate 16 from a side of the substrate 16 opposite to the light sensing element 32. For example, the light sensing device 2 may be a color filter substrate of a display device or be disposed on a display surface of the display device, but it is not limited thereto. In some embodiments, the light sensing unit 10 may further include a light blocking layer disposed on a side of the semiconductor layer 122 opposite to the substrate 16 to reduce interference of other light. In some embodiments, the light sensing unit 30 may be applied to the light sensing device shown in FIG. 5 or FIG. 7 or other suitable light sensing devices, but not limited thereto.

In the switching element 34 shown in FIG. 8, the source 143 and the drain 144 may be disposed on the substrate 16, and for example, may be formed of the non-transparent conductive layer M1. The semiconductor layer 142 may be disposed on the source 143, the drain 144, and the substrate 16. The gate 141 may be disposed on the semiconductor layer 142 and overlap the source 143 and the drain 144 in the normal direction ND, and the gate insulating layer 123 may be disposed between the gate 141 and the semiconductor layer 142 and separate the gate 141 from the semiconductor layer 142. The gate 141 and the gate 121 may be formed of the same non-transparent conductive layer M2, for example.

FIG. 9 schematically illustrates a top view of a light sensing element according to another embodiment of the present invention. As shown in FIG. 9, the light sensing element 42 of this embodiment differs from the light sensing element 12 shown in FIG. 1 in that one of the source 124 and the drain 125 may include a non-transparent conductive material, and another one of the source 124 and the drain 125 may include a transparent conductive material. In the embodiment of FIG. 9, the source 124 may include a non-transparent conductive material, for example be formed of the non-transparent conductive layer M2, and the drain 125 may include a transparent conductive material, for example be formed of the light-transmissive conductive layer T1, but not limited to this. In the present invention, the non-transparent conductive material is a material that light cannot pass through, for example, it includes a metal material. In some embodiments, the source 124 may include the transparent conductive material, and the drain 125 may include the non-transparent conductive material. In such case, the source 124 may be formed of the light-transmissive conductive layer T1, and the drain 125 may be formed of the non-transparent conductive layer M2. In some embodiments, one of the source 124 and the drain 125 of the light sensing element 32 shown in FIG. 8 may include the non-transparent conductive material, and the other of them may include the transparent conductive material, for example, they are formed of the non-transparent conductive layer M2 and the light-transmissive conductive layer T1, respectively.

Figure 10:
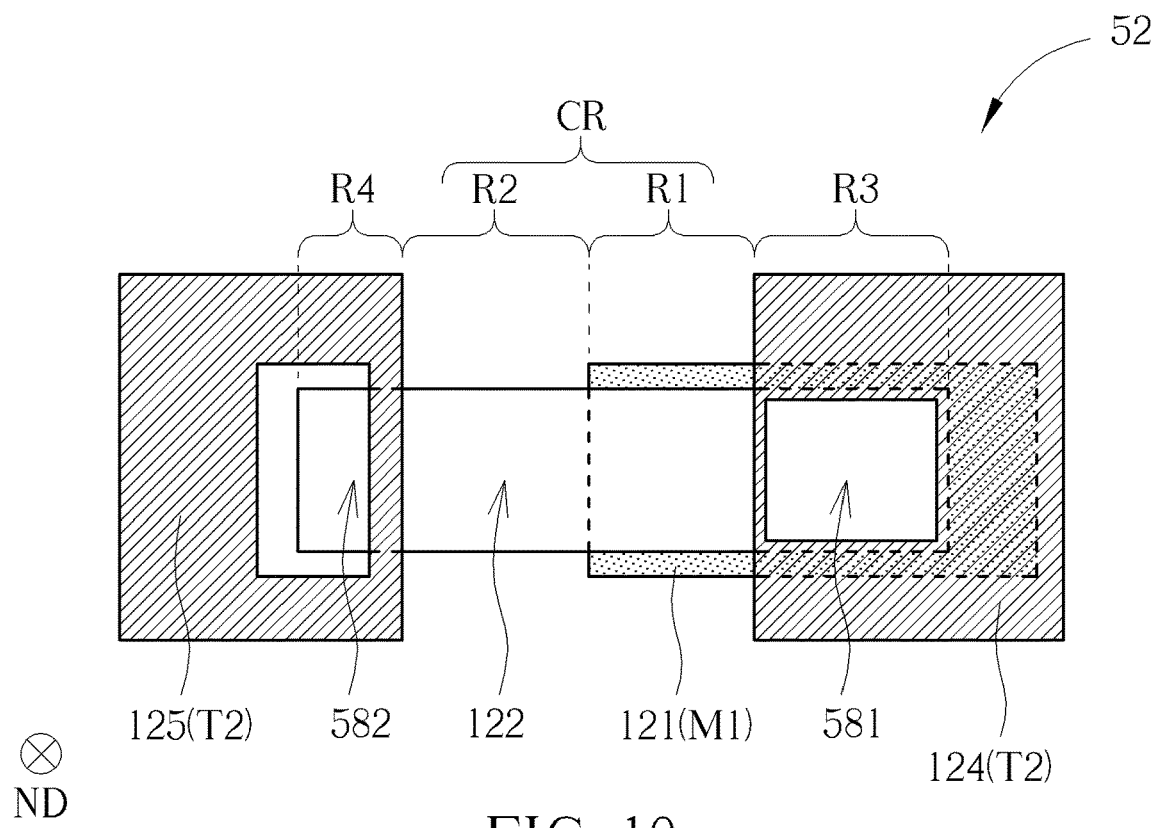
FIG. 10 schematically illustrates a top view of a light sensing element according to another embodiment of the present invention.

FIG. 10 schematically illustrates a top view of a light sensing element according to another embodiment of the present invention. As shown in FIG. 10, the light sensing element 52 of this embodiment differs from the photo-sensing element 12 shown in FIG. 1 in that the light-transmissive conductive layer T2 of this embodiment may include the non-transparent conductive material, and the light-transmissive conductive layer T2 may have a through opening overlapping the semiconductor layer 122 of the light sensing element 52 in the normal direction ND of the substrate (e.g., the substrate 16 of FIG. 2). In the embodiment of FIG. 10, both the source 124 and the drain 125 may be formed of the light-transmissive conductive layer T2, the source 124 may include at least one through opening 581, and the drain 125 may include at least one through opening 582, in which the through opening 581 and the through opening 582 penetrate through the light-transmissive conductive layer T2. The through opening 581 of the source 124 and the through opening 582 of the drain 125 may respectively expose at least a part of the third region R3 and at least a part of the fourth region R4 of the semiconductor layer 122, so that the third region R3 and the fourth region R4 of the semiconductor layer 122 may receive light, thereby improving the signal-to-noise ratio of the light sensing element 52. In this embodiment, the third region R3 and the fourth region R4 may be respectively defined as regions of areas surrounded by the outer contours of the source 124 and the drain 125 overlapping the semiconductor layer 122. In some embodiments, the non-transparent conductive material of the light-transmissive conductive layer T2 may be the same as the non-transparent conductive material of the source 143 and the drain 144 shown in FIG. 2, for example, the light-transmissive conductive layer T2 and the non-transparent conductive layer M2 may be formed of the same layer, but not limited thereto.

As shown in FIG. 10, in some embodiments, in the normal direction ND, the through opening 581 of the source 124 and the through opening 582 of the drain 125 may have the same size or different sizes. In some embodiments, in the normal direction ND, when the source 124 and the drain 125 may contact the semiconductor layer 122, the through opening 581 of the source 124 may at least partially overlap the third region R3 of the semiconductor layer 122 and/or the through opening 582 of the drain 125 may at least partially overlap the fourth region R4 of the semiconductor layer 122. For example, the through opening 581 of the source 124 may extend beyond the third region R3 of the semiconductor layer 122, but not limited thereto. In some embodiments, one of the source 124 and the drain 125 may not have a through opening. In such case, the one of the source 124 and the drain 125 may be formed of the non-transparent conductive layer M2 or may be formed of the transparent conductive layer M2 as shown in above FIG. 2. In some embodiments, the light-transmissive conductive layer T2 shown in FIG. 10 may be applied to the light sensing unit shown in FIG. 2, FIG. 3, or FIG. 8 and/or the light sensing device shown in FIG. 5 or FIG. 7.

Figure 11:
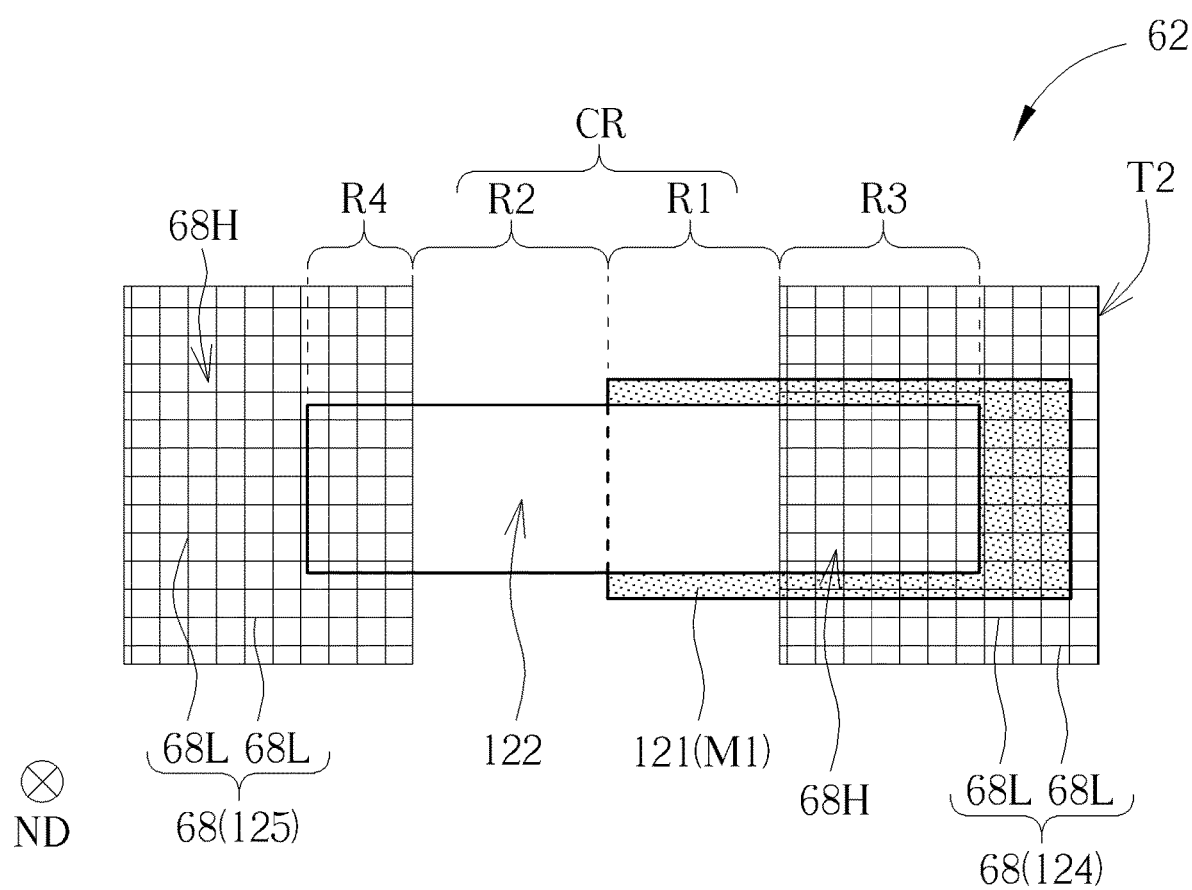
FIG. 11 schematically illustrates a top view of a light sensing element according to another embodiment of the present invention.

FIG. 11 schematically illustrates a top view of a light sensing element according to another embodiment of the present invention. As shown in FIG. 11, the light sensing element 62 of this embodiment differs from the light sensing element 52 shown in FIG. 10 in that the light-transmissive conductive layer T2 forming the source 124 and the drain 125 of this embodiment may include metal mesh 68. Specifically, the metal mesh 68 may include a plurality of thin metal wires 68L crossing and being connected to each other. The thin metal wires 68L may include the non-transparent conductive material, such as the metal material. Since the thin metal wires 68L may form a plurality of mesh holes 68H, light may still be irradiated on the third region R3 and/or the fourth region R4 of the semiconductor layer 122 through the mesh holes 68H, so as to improve the signal-to-noise ratio of the light sensing element 62. The width of the thin metal wire 68L may be adjusted according to the transmittance requirement of the metal mesh 68. In the embodiment of FIG. 11, the source 124 and the drain 125 may both be formed of the metal mesh 68, but not limited thereto. In some embodiments, one of the source 124 and the drain 125 may not have the metal mesh 68. In such case, the one of the source 124 and the drain 125 may be formed of the non-transparent conductive layer M2, the light-transmissive conductive layer T2 shown in FIG. 10 or the light-transmissive conductive layer T1 shown in FIG. 2. In some embodiments, the light-transmissive conductive layer T2 shown in FIG. 11 may be applied to the light sensing unit shown in FIG. 2, FIG. 3, or FIG. 8 and/or the light sensing device shown in FIG. 5 or FIG. 7.

In summary, in the light sensing element of the present invention, at least one of the source and the drain may be formed of the light-transmissive conductive layer, such that light may pass through the source and/or the drain. Therefore, the light-receiving area of the semiconductor layer may be increased to increase the drain current when the semiconductor layer receives light and improve the signal-to-noise ratio of the light-sensing element.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A light sensing unit of a light sensing device, comprising:
   a light sensing element, comprising:
      a first gate disposed on a substrate;
      a first semiconductor layer disposed on the substrate;
      a gate insulating layer separating the first gate from the first semiconductor layer; and
      a first source and a first drain connected to the first semiconductor layer respectively, and at least one of the first source and the first drain being formed of a light-transmissive conductive layer, wherein the first semiconductor layer is disposed between one of the first source and the first drain and the first gate, and wherein when viewed along a normal direction of the substrate, the first gate overlaps the one of the first source and the first drain, and the first gate does not overlap another one of the first source and the first drain;
   a switching element electrically connected to the light sensing element, wherein the switching element comprises a second source and a second drain;
   a light blocking layer disposed under the first semiconductor layer, wherein the light blocking layer and the first gate are disposed on a same side of the first semiconductor layer, and wherein when viewed along the normal direction of the substrate, a total projection area of both the light blocking layer and the first gate projected onto the substrate is greater than or equal to a projection area of the first semiconductor layer projected onto the substrate, and a part of the light blocking layer does not overlap the first gate; and
   an insulating layer separating the first gate from the light blocking layer,
   wherein the light sensing element is a bottom-gate type thin film transistor or a top-gate type thin film transistor.

2. The light sensing unit of the light sensing device according to claim 1, wherein the switching element further comprises:
   a second gate disposed on the substrate; and
   a second semiconductor layer disposed on the substrate, and the gate insulating layer separating the second gate from the second semiconductor layer, wherein the second source and the second drain are connected to the second semiconductor layer respectively, and when viewed along the normal direction of the substrate, the second gate overlaps the second source and the second drain.

3. The light sensing unit of the light sensing device according to claim 1, wherein the first source and the first drain are formed of the light-transmissive conductive layer.

4. The light sensing unit of the light sensing device according to claim 1, wherein the first gate is disposed between the first semiconductor layer and the substrate.

5. The light sensing unit of the light sensing device according to claim 1, wherein the first semiconductor layer is disposed between the substrate and the first gate.

6. The light sensing unit of the light sensing device according to claim 1, wherein when viewed along the normal direction of the substrate, the first semiconductor layer has a channel region disposed between the first source and the first drain, the channel region has a first region and a second region, the first region overlaps the first gate, and the second region does not overlap the first gate.

7. The light sensing unit of the light sensing device according to claim 6, wherein a width of the second region in an extending direction of the first semiconductor layer is greater than or equal to 0.1 times a width of the channel region in the extending direction and less than or equal to 0.9 times the width of the channel region.

8. The light sensing unit of the light sensing device according to claim 1, wherein the light-transmissive conductive layer comprises a transparent conductive material.

9. The light sensing unit of the light sensing device according to claim 1, wherein the one of the first source and the first drain comprises a non-transparent conductive material, and the another one of the first source and the first drain comprises a transparent conductive material.

10. The light sensing unit of the light sensing device according to claim 9, wherein the one of the first source and the first drain is formed of a non-transparent conductive layer, and the another one of the first source and the first drain is formed of the light-transmissive conductive layer.

11. The light sensing unit of the light sensing device according to claim 1, wherein the light-transmissive conductive layer comprises a non-transparent conductive material, and the light-transmissive conductive layer has at least one through opening.

12. The light sensing unit of the light sensing device according to claim 11, wherein the second source and the second drain comprise a non-transparent conductive material, and the non-transparent conductive material of the light-transmissive conductive layer is the same as the non-transparent conductive material of the second source and the second drain.

13. The light sensing unit of the light sensing device according to claim 1, wherein the light-transmissive conductive layer comprises metal mesh.

* * * * *